(12) United States Patent
Kim et al.

(10) Patent No.: US 11,606,634 B2
(45) Date of Patent: *Mar. 14, 2023

(54) HOME APPLIANCE HAVING SPEECH RECOGNITION FUNCTION

(71) Applicant: Samsung Electronics Co., Ltd., Suwon-si (KR)

(72) Inventors: Hwa-Sung Kim, Yongin-si (KR); Dong Hyun Sohn, Hwaseong-si (KR); Ji-Eun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/669,633

(22) Filed: Feb. 11, 2022

(65) Prior Publication Data

US 2022/0167071 A1     May 26, 2022

Related U.S. Application Data

(63) Continuation of application No. 16/643,214, filed as application No. PCT/KR2018/007375 on Jun. 29, 2018, now Pat. No. 11,259,103.

(30) Foreign Application Priority Data

Aug. 31, 2017    (KR) .................. 10-2017-0111460

(51) Int. Cl.
    *G10L 21/00*         (2013.01)
    *G10L 25/00*         (2013.01)
    (Continued)

(52) U.S. Cl.
    CPC ................ *H04R 1/04* (2013.01); *G10L 15/26* (2013.01); *G10L 15/28* (2013.01); *H04R 1/025* (2013.01)

(58) Field of Classification Search
CPC . G06F 3/16; G10L 15/22; G10L 15/26; G10L 15/28; H04R 1/021; H04R 1/025; H04R 1/028; H04R 1/04; H04R 1/08
(Continued)

(56) References Cited

U.S. PATENT DOCUMENTS 9,525,926 B2    12/2016   Kim et al.
9,739,004 B2 *   8/2017   Ha ........................ D06F 33/37
(Continued)

FOREIGN PATENT DOCUMENTS

CN        202709615 U     1/2013
CN        103024625 A     4/2013
(Continued)

OTHER PUBLICATIONS

ISA/KR, International Search Report and Written Opinion of the International Search Authority, International Application No. PCT/KR2018/007375, dated Oct. 19, 2018, 17 pages.
(Continued)

*Primary Examiner* — Maria El-Zoobi
(74) *Attorney, Agent, or Firm* — Staas & Halsey LLP

(57) ABSTRACT

A home appliance includes an electrical equipment compartment disposed in an upper portion of the home appliance, and including an upper side that is open, an electrical equipment compartment cover to cover the open upper side of the electrical equipment compartment, and including a speaker hole, a microphone accommodating portion which protrudes upward from an upper side of the electrical equipment compartment cover and including an accommodating space and a front portion that includes microphone holes laterally spaced apart from each other and which face toward a front of the home appliance, a microphone unit including a printed circuit board (PCB) disposed in the accommodation space behind the microphone holes and
(Continued)

including microphone chips mounted on the PCB, and a speaker unit disposed in the electrical equipment compartment to correspond to the speaker hole.

7 Claims, 15 Drawing Sheets

(51) Int. Cl.
  *H04R 1/04* (2006.01)
  *G10L 15/26* (2006.01)
  *G10L 15/28* (2013.01)
  *H04R 1/02* (2006.01)
(58) Field of Classification Search
  USPC .......................................................... 704/275
  See application file for complete search history.

(56) References Cited

U.S. PATENT DOCUMENTS

| | | | | |
|---|---|---|---|---|
| 9,819,915 | B2* | 11/2017 | Ku | G06F 1/163 |
| 9,863,077 | B2* | 1/2018 | Jung | D06F 33/38 |
| 9,866,662 | B2* | 1/2018 | Lee | H04M 1/03 |
| 10,351,416 | B2* | 7/2019 | Rombach | B81B 7/0048 |
| 11,118,294 | B2 | 9/2021 | An et al. | |
| 11,259,103 | B2* | 2/2022 | Kim | H04R 1/04 |
| 2005/0168910 | A1* | 8/2005 | Won | H01G 5/145 361/277 |
| 2006/0002576 | A1* | 1/2006 | Akino | H04R 1/021 381/361 |
| 2010/0189914 | A1* | 7/2010 | Coulson | C09D 133/16 524/556 |
| 2013/0089218 | A1* | 4/2013 | Kishinami | H04R 1/403 381/92 |
| 2013/0222192 | A1* | 8/2013 | Seo | H04M 1/0262 343/702 |
| 2013/0255327 | A1* | 10/2013 | Park | D06F 34/34 68/13 R |
| 2014/0004904 | A1 | 1/2014 | Rao et al. | |
| 2014/0294217 | A1* | 10/2014 | Yamaguchi | H04M 1/035 381/334 |
| 2014/0367808 | A1* | 12/2014 | Kuratani | H01L 24/09 257/692 |
| 2015/0078565 | A1* | 3/2015 | Tu | H04R 7/00 381/94.1 |
| 2015/0345065 | A1* | 12/2015 | Yang | D06F 34/28 700/275 |
| 2015/0379992 | A1* | 12/2015 | Lee | G06F 1/3206 704/275 |
| 2016/0066083 | A1* | 3/2016 | Son | G10L 17/00 381/92 |
| 2016/0115632 | A1* | 4/2016 | Jung | H02P 29/02 68/12.05 |
| 2016/0215430 | A1* | 7/2016 | Ha | H04L 12/282 |
| 2016/0219359 | A1* | 7/2016 | Kim | H04R 1/1041 |
| 2016/0345113 | A1* | 11/2016 | Lee | G01S 15/04 |
| 2016/0379642 | A1* | 12/2016 | Ko | G10L 15/285 704/275 |
| 2017/0055353 | A1* | 2/2017 | Park | H04M 1/0277 |
| 2017/0069324 | A1 | 3/2017 | Gardner et al. | |
| 2017/0079482 | A1* | 3/2017 | Tsibulevskiy | A45D 42/16 |
| 2017/0149942 | A1* | 5/2017 | Lee | H04M 1/026 |
| 2017/0206900 | A1* | 7/2017 | Lee | G10L 15/08 |
| 2017/0211222 | A1* | 7/2017 | Kim | D06F 31/00 |
| 2017/0245360 | A1* | 8/2017 | Jung | H04N 5/2257 |
| 2017/0251186 | A1* | 8/2017 | Ku | H04N 9/3155 |
| 2017/0278477 | A1* | 9/2017 | Jeong | F16M 11/18 |
| 2017/0293272 | A1* | 10/2017 | Jeong | F16M 11/2014 |
| 2017/0340106 | A1* | 11/2017 | Choi | A47B 47/03 |
| 2018/0002856 | A1* | 1/2018 | Hombroek | D06F 35/006 |
| 2018/0002857 | A1* | 1/2018 | Hombroek | D06F 35/005 |
| 2018/0002858 | A1* | 1/2018 | Hombroek | D06F 39/02 |
| 2018/0002859 | A1* | 1/2018 | Hombroek | D06F 35/006 |
| 2018/0063981 | A1* | 3/2018 | Park | H04R 1/023 |
| 2018/0080162 | A1* | 3/2018 | Hoppe | D06F 37/268 |
| 2018/0080164 | A1* | 3/2018 | Hoppe | D06F 35/006 |
| 2018/0171534 | A1* | 6/2018 | Chae | D06F 33/47 |
| 2019/0186064 | A1* | 6/2019 | Kim | D06F 34/18 |
| 2019/0214011 | A1* | 7/2019 | Shin | G10L 21/0216 |
| 2020/0213700 | A1* | 7/2020 | Kim | H04R 1/08 |

FOREIGN PATENT DOCUMENTS

| | | |
|---|---|---|
| CN | 106356061 A | 1/2017 |
| CN | 206117701 U | 4/2017 |
| CN | 106679326 A | 5/2017 |
| CN | 106839590 A | 6/2017 |
| DE | 3503141 A1 | 8/1986 |
| EP | 2031121 A1 | 3/2009 |
| JP | 2006-342996 | 12/2006 |
| JP | 2008-92183 | 4/2008 |
| JP | 2013-239854 | 11/2013 |
| JP | 2015-31498 | 2/2015 |
| JP | 2016-183786 | 10/2016 |
| JP | 2017-69835 | 4/2017 |
| JP | 2017-133818 | 8/2017 |
| JP | 6449073 | 1/2019 |
| KR | 10-2001-0073929 A | 8/2001 |
| KR | 10-2004-0016244 | 2/2004 |
| KR | 10-2006-0097455 A | 9/2006 |
| KR | 10-2013-0109356 A | 10/2013 |
| KR | 10-2014-0095779 A | 8/2014 |
| KR | 10-2014-0131197 | 11/2014 |
| KR | 10-2016-0003211 | 1/2016 |
| KR | 10-2016-0100731 | 8/2016 |
| KR | 10-2016-0137240 A | 11/2016 |
| KR | 10-2017-0001406 A | 1/2017 |
| KR | 10-2017-0017204 | 2/2017 |
| KR | 10-2017-0093629 A | 8/2017 |
| KR | 10-2019-0084853 | 7/2019 |
| WO | 2015/055239 A1 | 4/2015 |

OTHER PUBLICATIONS

Supplementary European Search Report dated Jul. 10, 2020 in connection with European Patent Application No. 18 85 0288, 6 pages.
Non-Final Office Action dated May 12, 2021 in U.S. Appl. No. 16/643,214.
Notice of Allowance dated Oct. 6, 2021 in U.S. Appl. No. 16/643,214.
Communication pursuant to Article 94(3) EPC dated Dec. 8, 2021, in connection with European Application No. 18850288.4, 4 pages.
Notice of Preliminary Rejection dated Sep. 27, 2021, in connection with Korean Application No. 10-2017-0111460, 14 pages.
Supplemental Notice of Allowability dated Jan. 5, 2022 in U.S. Appl. No. 16/643,214.
Supplemental Notice of Allowability dated Jan. 12, 2022 in U.S. Appl. No. 16/643,214.
U.S. Appl. No. 16/643,214, filed Feb. 28, 2020, Hwa-Sung Kim, Samsung Electronics Co., Ltd.
European Search Report dated Nov. 18, 2022, in European Application No. EP 22 18 7067.
Office Action dated Jan. 18, 2023, in Korean Application No. 10-2022-0057705.

* cited by examiner

HOME APPLIANCE HAVING SPEECH RECOGNITION FUNCTION

CROSS-REFERENCE TO RELATED APPLICATIONS

This application is a continuation application of U.S. patent application Ser. No. 16/643,214 filed on Feb. 28, 2020, now U.S. Pat. No. 11,259,103. U.S. patent application Ser. No. 16/643,214 is a 371 National Stage of International Application No. PCT/KR2018/007375, filed Jun. 29, 2018, which claims priority to Korean Patent Application No. 10-2017-0111460, filed Aug. 31, 2017. The disclosures of U.S. patent application Ser. No. 16/643,214, International Application No. PCT/KR2018/007375, and Korean Patent Application No. 10-2017-0111460 are herein incorporated by reference in their entirety.

BACKGROUND

1. Field

The disclosure relates to a home appliance capable of performing a function by recognizing a speech of a user.

2. Description of Related Art

Recently, home appliances such as washing machines, electric ovens, and air conditioners provide users with various options to implement various functions.

In the case of providing such various options, home appliances may be provided with manipulators such as various buttons to allow users to select functions and options through manipulation, but in a case where a user is not fully familiar with the manipulation method, the user may feel difficulty in manipulation.

Therefore, there is a need for a product that is easily operated by users.

SUMMARY

The disclosure is directed to providing a home appliance capable of being operated by a speech of a user.

The disclosure is directed to providing a home appliance capable of being operated by a user at a remote site without moving to the home appliance.

One aspect of the disclosure provides a home appliance including a main body forming an outer appearance, a microphone unit disposed to direct to the front of the main body to detect a speech of a user and comprising a plurality of sensing portions disposed to be spaced apart from each other along a horizontal direction, and a speaker unit disposed to be spaced apart from the microphone unit by a predetermined distance.

The microphone unit may include a microphone chip including the sensing portion and a printed circuit board on which the microphone chip is mounted.

The home appliance may further include a buffer member disposed around the sensing portion to reduce transmission of vibration and noise to the sensing portion.

The home appliance may further include a microphone hole provided at a position corresponding to the sensing portion in the main body such that sound is transmitted to the sensing portion; and a waterproof sheet disposed in the rear of the microphone hole to block water from being introduced into the sensing portion through the microphone hole.

A fixing protrusion for guiding a position of the microphone unit may be provided inside the main body, and a guide hole for allowing the fixing protrusion to be inserted therein may be provided on the printed circuit board.

The microphone unit may be fixed inside the main body through a double-sided tape.

The microphone unit may be disposed at an upper center of the main body, and the speaker unit may be disposed at an upper side of the main body to be spaced apart from the microphone unit.

The home appliance may further include a speaker hole provided in the main body such that sound output from the speaker unit is transmitted to the outside of the main body.

The speaker hole may be disposed below the speaker unit.

A guide rib disposed between the speaker unit and the speaker hole transmission space such that sound output from the speaker unit is transmitted to the outside of the main body through the speaker hole may be provided inside the main body.

Another aspect of the disclosure provides a home appliance including a main body including a cavity for cooking food, a control panel installed on a front surface of the main body and including an manipulator for the operation of a user and a display for indicating an operation state, a microphone unit disposed inside the control panel to detect a speech of the user, and a speaker unit disposed inside the control panel to be spaced apart from the microphone unit and outputting sound to the user.

The microphone unit may be disposed on a central portion of the control panel, and the speaker unit may be disposed on one side of the control panel.

The microphone unit may be disposed below the manipulator while being disposed on one side of the control panel, and the speaker unit may be disposed on the other side of the display.

The speaker unit may be disposed such that a diaphragm directs to one side of the control panel.

The speaker unit may be disposed such that the diaphragm directs to the front of the control panel, and the home appliance may further include a speaker hole formed on the control panel and disposed below the speaker unit such that sound output from the speaker unit is transmitted to the outside of the main body.

Another aspect of the disclosure provides a speaker unit including a main body including a discharge port for blowing wind through a front surface thereof, a microphone unit installed on an upper end of the main body to recognize a speech of a user, and a speaker unit disposed to be spaced apart from the microphone unit by a predetermined distance.

The microphone unit may include a printed circuit board, a pair of microphone chips disposed on the printed circuit board to be spaced apart from each other, and connectors installed on the printed circuit board to transmit an output speech signal from the microphone chips.

The speaker unit may further include a microphone cover to which the microphone unit is coupled, and the microphone cover may be detachably coupled to the main body.

An electrical equipment compartment in which electrical equipment is installed may be provided at an upper portion of the main body, and the speaker unit may be received in the electrical equipment compartment.

Because a user can operate a home appliance by using a speech of the user without directly manipulating manipulators and receive an operation state with speech, usability of the home appliance can be improved.

Further, because the home appliance can be manipulated through speech recognition and the manipulators for selecting functions and options can be simplified, anesthetic feeling of the home appliance can be improved and the manufacturing cost of the home appliance can be reduced.

DETAILED DESCRIPTION

Like reference numbers or signs in the various drawings of the application represent parts or components that perform substantially the same functions. In the term including 'portion' to be used hereinafter, the 'portion' may be implemented as one component or as a plurality of components according to an embodiment.

In the specification, when a part is described as being connected to another part, it may mean a physical connection or an electrical connection according to a part and a different part.

When a part is described as including another part, it does not exclude another part other than the other part unless there is a description to the contrary, and it means that it may further include another part according to the designer's choice.

The terms "first" and "second" are used to distinguish one part from another part, and unless otherwise specified, they do not mean a sequential expression. The term "and/or" includes any combination of a plurality of related items or any one of a plurality of related items. For example, the scope of the expression or phrase "A and/or B" includes the item "A", the item "B", and the combination of items "A and B". In addition, the scope of the expression or phrase "at least one of A and B" is intended to include all of the following: (1) at least one of A, (2) at least one of B, and (3) at least one A and at least one of B. Likewise, the scope of the expression or phrase "at least one of A, B, and C" is intended to include all of the following: (1) at least one of A, (2) at least one of B, (3) at least one of C, (4) at least one of A and at least one of B, (5) at least one of A and at least one of C, (6) at least one of B and at least one of C, and (7) at least one of A, at least one of B, and at least one of C.

The singular expressions herein may include plural expressions, unless the context clearly dictates otherwise.

In this specification, the terms "front end," "rear end," "upper portion," "lower portion," "upper end" and "lower end" used in the following description are defined with reference to the drawings, and the shape and position of each component are not limited by these terms.

Hereinafter, embodiments of the disclosure will be described in detail with reference to the accompanying drawings.

The disclosure is applicable to any home appliance that requires an operation of a user. For example, the home appliance may include a washing machine, a refrigerator, an oven, a dishwasher, a robot cleaner, and an air conditioner.

Figure 8:
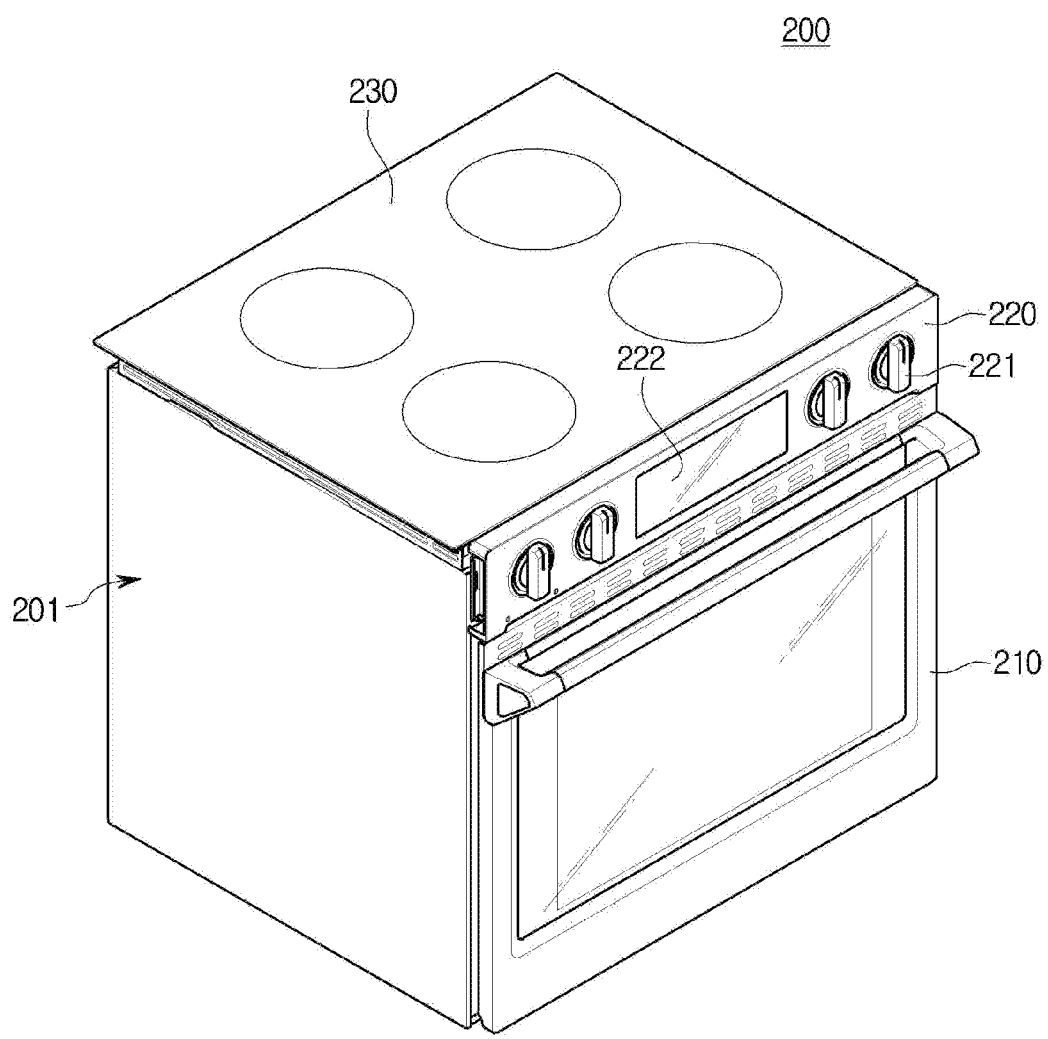
FIG. 8 is a perspective view of an oven as a home appliance according to another embodiment of the disclosure.
Figure 13:
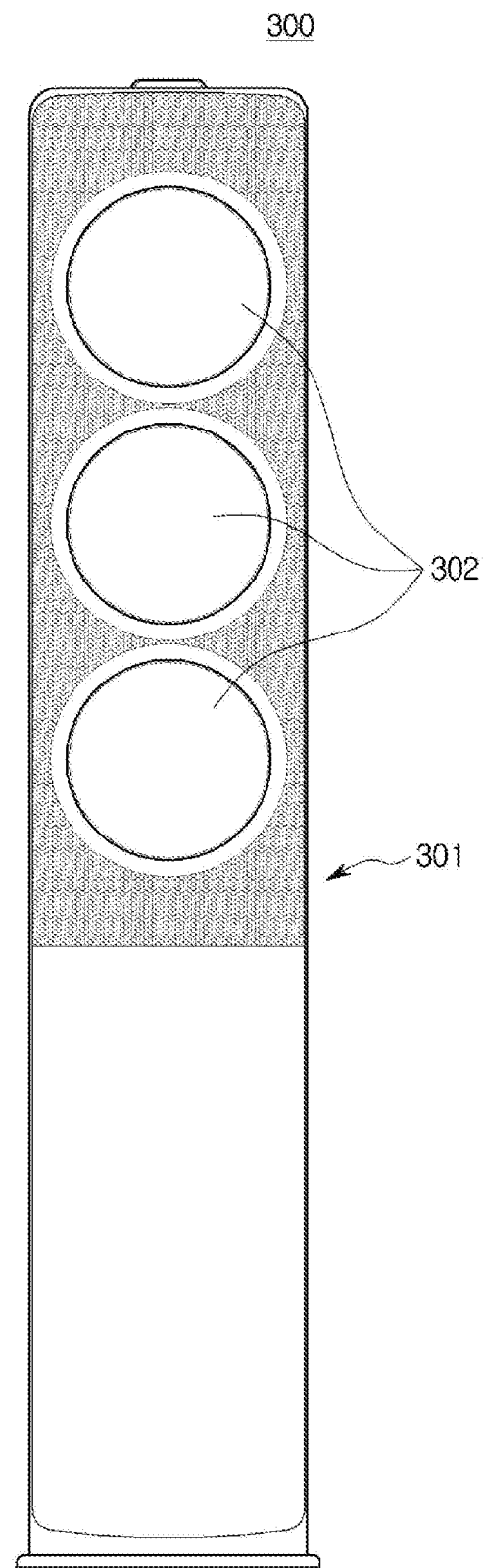
FIG. 13 is a view illustrating an indoor unit of an air conditioner as a home appliance according to another embodiment of the disclosure.

FIGS. 1 to 5 illustrate a washing machine as an example of a home appliance. FIG. 8 illustrates an oven as an example of a home appliance, and FIG. 13 illustrates an air conditioner as an example of a home appliance. Although not shown in the drawings, various home appliances including a refrigerator may be presented.

Figure 1:
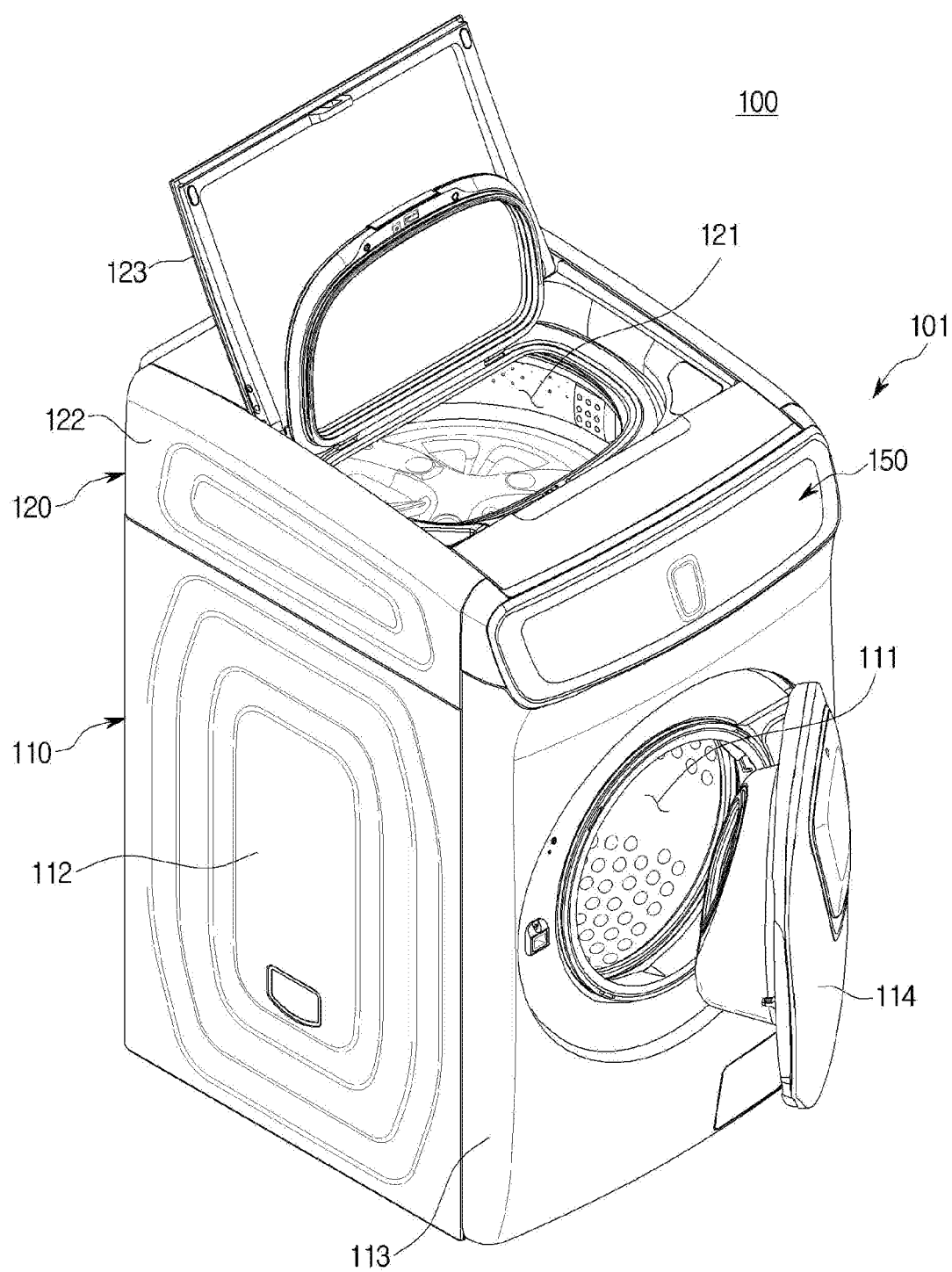
FIG. 1 is a perspective view of a washing machine as a home appliance according to an embodiment of the disclosure.
Figure 2:
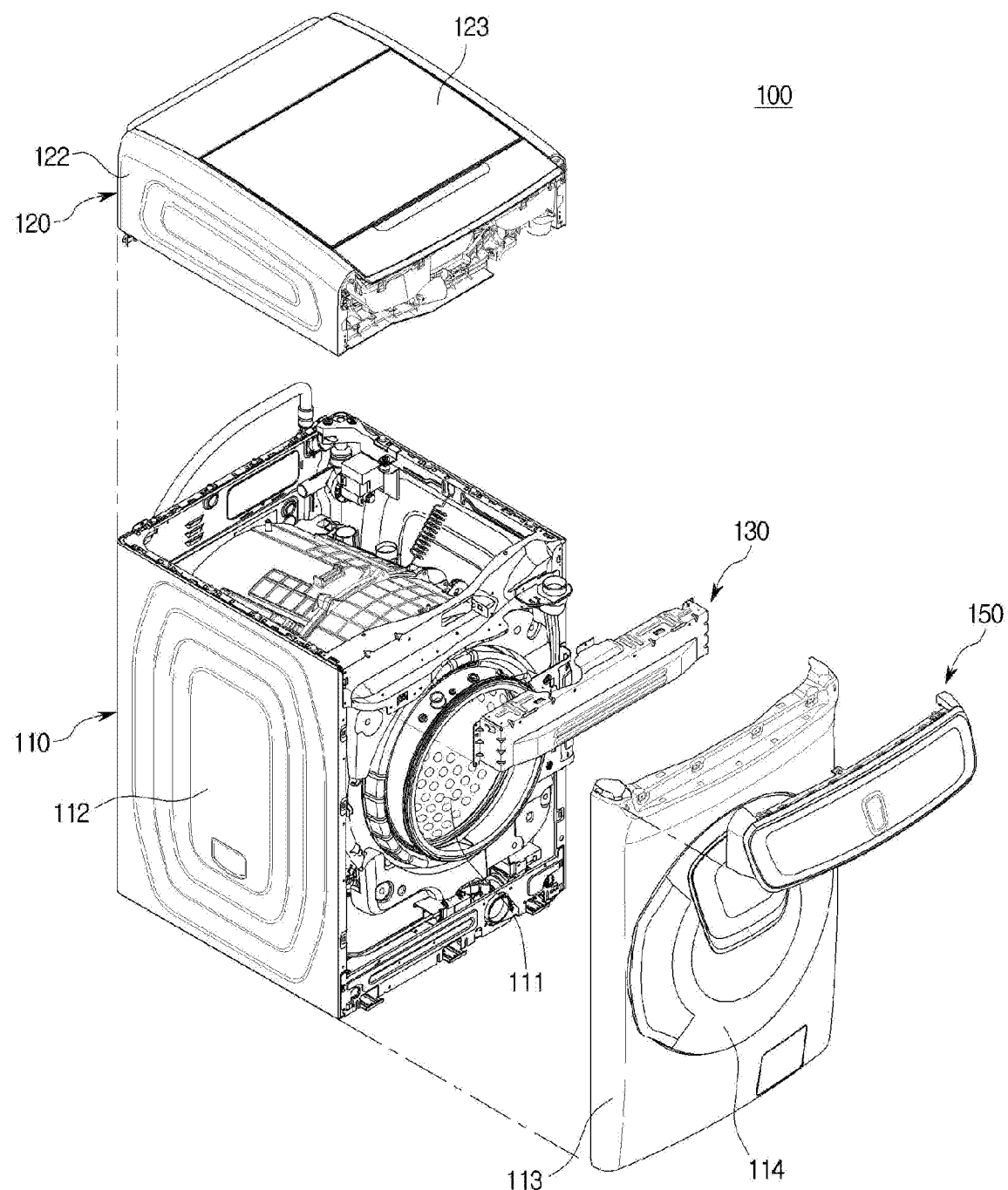
FIG. 2 is a view illustrating a state in which some components in FIG. 1 are disassembled.

FIG. 1 is a perspective view of a washing machine as a home appliance according to an embodiment of the disclosure. FIG. 2 is a view illustrating a state in which some components in FIG. 1 are disassembled.

As illustrated in FIGS. 1 and 2, in an embodiment, a washing machine 100 may include a main body 101 forming an outer appearance, and the main body 101 may include a plurality of washing parts 110 and 120. For example, the washing machine 100 may include the first washing part 110 in which a first washing space 111 is provided, and the second washing part 120 in which a second washing space 121 is provided. FIGS. 1 and 2 only illustrate an embodiment in which the washing machine 100 includes two of the washing parts 110 and 120, but this is exemplary. That is, according to a designer's choice, only one washing part or three or more washing parts provided in one of the washing machine 100 is included in the disclosure.

The first washing part 110 may include a first housing 112 forming a side outer appearance, a front housing 113 forming a front outer appearance, and a first door 114 rotatably installed on the front housing 113 to open and close the first washing space 111.

The second washing part 120 may also include a second housing 122 forming a side outer appearance, and a second door 123 to open and close the second washing space 121.

According to an embodiment, the washing machine 100 may include a fixing bracket 130 configured to couple the first housing 112 and the second housing 122 so as not to be separated from each other. The fixing bracket 130 may be coupled to, for example, the front of the first housing 112 and the front of the second housing 122. The fixing bracket 130 may also be coupled to a side of the first housing 112 and a side of the second housing 122, or to the rear of the first housing 112 and the rear of the second housing 122, depending on the designer's consideration.

The washing machine 100 may further include a control panel 150. The control panel 150 may be disposed at an upper portion of the front housing 140 of the washing machine 100 and coupled to the front housing 113 and the second housing 122, for example, for the convenience of the operation of a user and information confirmation. However, the arrangement position of the control panel 150 is not limited thereto.

The control panel 150 may be provided with a user interface 151 configured to receive various commands related to the operation of the washing machine 100, and/or to visually and/or audibly provide information related to the washing machine 100.

The user interface 151 may include at least one input device and/or at least one output device. The input device may be implemented using at least one of, for example, a physical button, a touch pad, a touch screen, a knob, a stick, a trackball, and a trackpad, and may be implemented using various devices that may be considered by the designer. The output device may include a display for visually outputting information, and the display may be implemented using, for example, a cathode ray tube (CRT) or various display panels such as a liquid crystal display panel (LCD), a light emitting diode (LED) display panel, an organic light emitting diode (OLED) display panel, and a quantum dot display panel. A sound output device may be implemented using a speaker device and the like.

Figure 3:
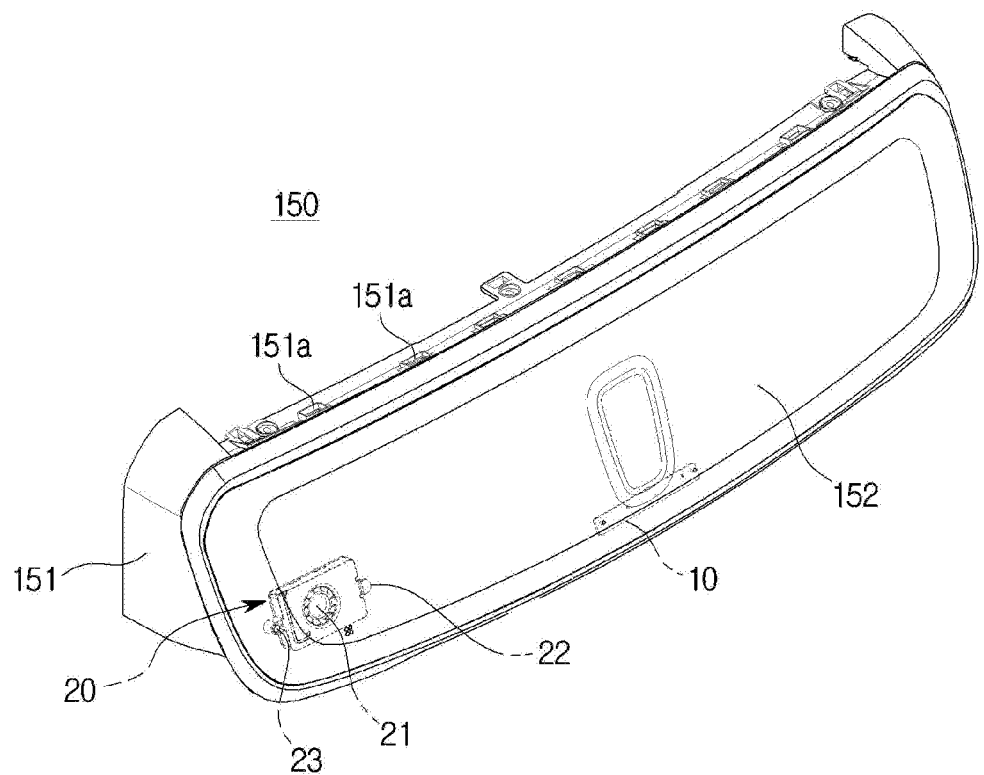
FIG. 3 is a perspective view of a control panel according to an embodiment.
Figure 4:
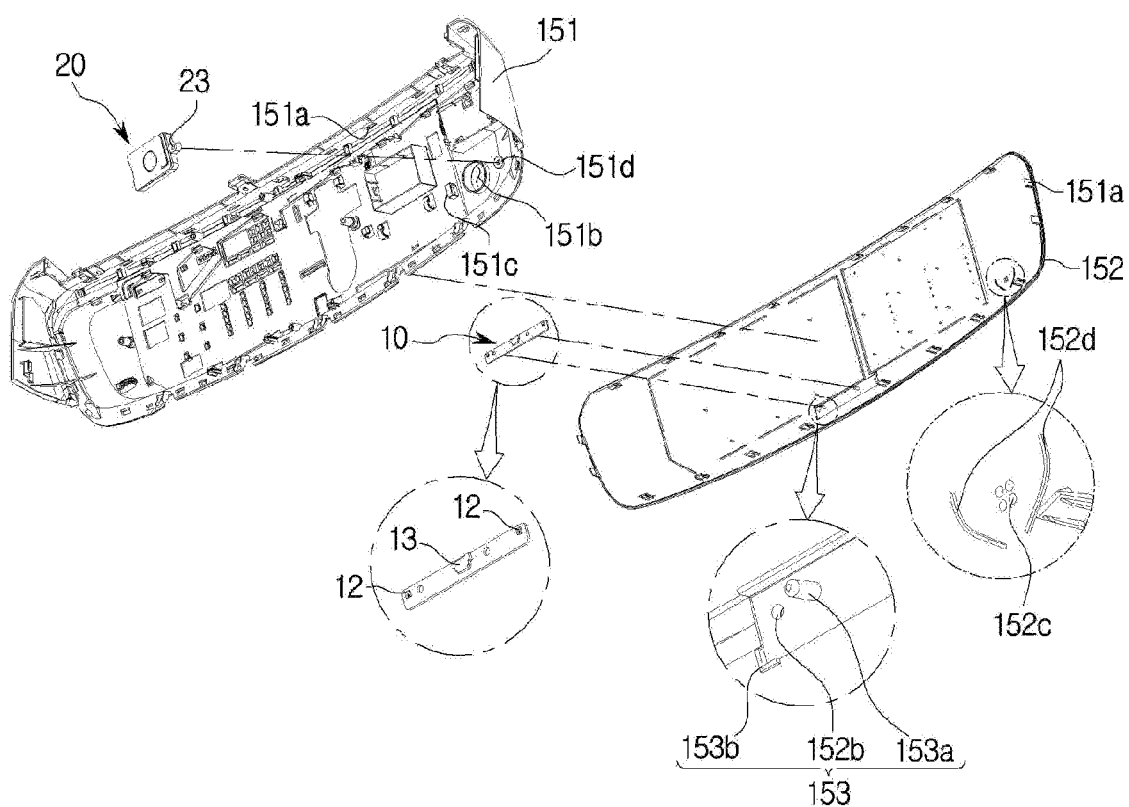
FIG. 4 is an exploded view illustrating a rear surface of the control panel in FIG. 3.
Figure 5:
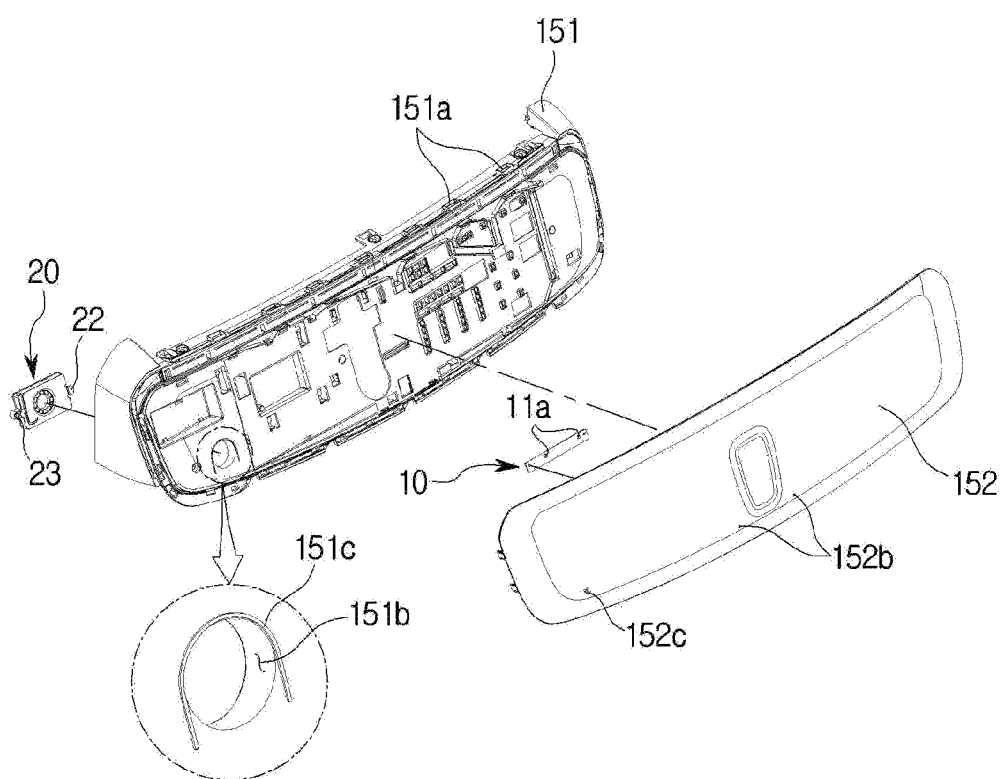
FIG. 5 is an exploded view illustrating a front surface of the control panel in FIG. 3.

FIG. 3 is a perspective view of a control panel according to an embodiment, FIG. 4 is an exploded view illustrating a rear surface of the control panel in FIG. 3, and FIG. 5 is an exploded view illustrating a front surface of the control panel in FIG. 3.

Referring to FIGS. 3 to 5, the control panel 150 may include a switch (not shown) constituting an interface, a panel body 151 to which various electronic components including a display (not shown) are installed, and a front cover 152 coupled to a front surface of the panel body 151.

The panel body 151 may form a coupling relationship with the front housing 113 (FIG. 2) and the second housing 122 (FIG. 2) described above.

The front cover 152 may be disposed in the front of the panel body 151 to cover the front surface of the panel body 151 in order to prevent moisture and dust from the outside from being introduced into components inside the control panel 150.

The front cover 152 may be provided with a transparent portion through which light emitted from a display element indicating an operation state of a home appliance may be transmitted to the outside, and an operation button for manipulating the operation of the home appliance.

A rear surface of the front cover 152 may be provided with a plurality of hooks 152a for coupling with the panel body 151, and the panel body 151 may be provided with hooking steps 151a at positions corresponding to the hooks 152a in a state of being coupled with the front cover 152 to form a coupling relationship with the hooks 152a.

The control panel 150 may be provided with a microphone unit 10 configured to sense sound in order to recognize a speech of the user.

The microphone unit 10 may be disposed in a space between the front cover 152 and the panel body 151, and the front cover 152 may be provided with a microphone hole 152b penetrating the inside and outside of the front cover 152 so that the speech of the user may be smoothly transmitted to the microphone unit 10.

According to an embodiment, the microphone unit 10 may be disposed at a central portion of the control panel 150. However, the arrangement position of the microphone unit 10 is not limited thereto and may vary depending on a space inside the control panel 150.

The microphone unit 10 may include a printed circuit board 11 on which a circuit constituting an electric circuit is patterned, and a microphone chip 12 installed on the printed circuit board 11.

The printed circuit board 11 may be provided with a connector 13 to which a terminal (not shown) is connected to transmit a speech signal collected from the microphone chip 12 to the outside of the printed circuit board 11.

The microphone chip 12 may be a micro electro mechanical system (MEMS) microphone in which ultra-fine mechanical parts and electronic circuits are integrated at the same time by applying a semiconductor manufacturing process.

A sensing portion 12a detecting sound from the microphone chip 12 may be disposed to direct to the front of the washing machine 100, and a pair of the microphone chips 12 may be provided to configure two channels and may be disposed on opposite sides of the printed circuit board 11 to be spaced apart from each other.

When the pair of microphone chips 12 are disposed to be spaced apart from each other as described above, a position of the user may be tracked through loudness of the speech of the user detected by two of the microphone chips 12, and through this process, a process of deleting the noise part from the input speech signal is possible by contrasting a speech signal input from the microphone chip 12 positioned at a close distance from the user's location with a speech signal input from the microphone chip 12 positioned at a long distance from the user's location, and the sensitivity of the microphone may be improved by amplifying the speech signal input from the microphone chip 12 positioned at a close distance from the user's location.

Because signal processing may be performed more efficiently as a distance between the pair of microphone chips 12 increases, the distance between the microphone chips 12 may be at least 30 mm or more. However, as the distance between the microchips increases, a width of the printed circuit board 11 may increase, which may adversely affect the placement of the printed circuit board inside the control panel 150, and thus the distance may not exceed 100 mm.

According to an embodiment, a pair of the microphone chips 12 are disposed in the microphone unit 10, but the number of the microphone chips 12 may be one, or three or more.

A fixing protrusion 153 may be provided at the rear surface of the front cover 152 to guide and fix the microphone unit 10 to an installation position so that the microphone unit 10 may be fixed to the control panel 150.

The fixing protrusion 153 may include a first fixing protrusion 153a formed to protrude in a columnar shape rearward from the rear surface of the front cover 152 at the installation position of the microphone unit 10, and a second fixing protrusion 153b formed around the installation position of the microphone unit 10 at the rear surface of the front cover 152.

The printed circuit board 11 of the microphone unit 10 may be provided with a guide hole 11a to allow the first fixing protrusion 153a to penetrate therethrough. The fixing protrusion 153 and the guide hole 11a may guide the microphone unit 10 to the installation position and at the same time provide a restraining force to fix the microphone unit 10 to the front cover 152.

When the microphone unit 10 is installed in the washing machine 100, the user may command the operation of the home appliance by a speech, the speech of the user may be transmitted to the microphone unit 10 to be converted into a speech signal, and when the speech signal is recognized as a command related to the operation of the home appliance through a process for speech recognition, the corresponding operation may be activated by a speech. The corresponding operation may be performed by communicating with a speech recognition server outside the home appliance in the process of recognizing the speech.

Therefore, the microphone unit 10 may be used as an input device among the interfaces for the operation of the washing machine.

The control panel 150 may be provided with a speaker unit 20 configured to output sound. The speaker unit 20 may be configured to output a speech by which a user may confirm an operation state of the home appliance and an operation command recognized by the microphone unit 10.

According to an embodiment, the speaker unit 20 may be installed at one side of the control panel 150 to be spaced apart from the microphone unit 10 installed at a central portion of the control panel 150. The reason why the microphone unit 10 and the speaker unit 20 are disposed to be separated from each other is to prevent a howling phenomenon in which when the microphone unit 10 and the speaker unit 20 operate simultaneously, sound of the speaker enters the microphone and is amplified and then comes out again through the speaker to form a loop and become in a oscillating state.

The speaker unit 20 may be installed on a rear surface of the control panel 150. The speaker unit 20 may be received in an inner space of the control panel 150 when a thickness thereof is sufficiently thin.

The speaker unit 20 may be coupled to a rear surface of the panel body 151, and in this case, the panel body 151 may be provided with a sound transmission hole 151*b* at a position corresponding to a diaphragm 21 of the speaker unit 20 in a state in which the speaker unit 20 is coupled to the panel body 151 so that sound output from the speaker unit 20 may be transmitted toward the front of the washing machine 100.

The speaker unit 20 may have a coupling structure for being coupled to the panel body 151. According to an embodiment, a locking protrusion 22 and a screw hole 23 may be provided on opposite sides of the speaker unit 20, and a locking portion 151*c* to allow the locking protrusion 22 to be inserted therein and a screw hole 151*d* corresponding to the screw hole 23 of the speaker unit 20 may be provided on the rear surface of the panel body 151. Such a coupling method is only one example, and the speaker unit 20 may be fixed to the panel body 151 using only a locking structure or using only a screw fastening structure.

A speaker hole 152*c* may be provided on the front cover 152 such that sound output from the speaker unit 20 may be transmitted toward the front of the washing machine 100.

The speaker hole 152*c* may be provided below the speaker unit 20 while being provided in the front of the speaker unit 20, and disposed below the sound transmission hole 151*b*.

This is to prevent moisture from being introduced into the speaker unit 20, and even though moisture is introduced into the speaker hole 152*c*, the introduced moisture does not direct to the speaker unit 20, but may be induced to flow downward along the space between the front cover 152 and the panel body 151 by gravity and to be discharged to the outside.

As the speaker hole 152*c* is disposed below the sound transmission hole 151*b*, a distance between the two becomes large, and thus in order to more smoothly transmit sound, a guide structure for guiding sound may be provided in a space between the speaker unit 20 and the sound transmission hole 151*b*.

According to an embodiment, the guide structure may include guide ribs 151*c* and 152*d* provided on the panel body 151 and the front cover 152.

The guide rib 151*c* may be formed along a periphery of the sound transmission hole 151*b* and may have a structure protruding from the front surface of the panel body 151.

The guide ribs 152*d* may be formed in the up-down direction on both sides of a space between the sound transmission hole 151*b* and the speaker hole 152*c* and may have a structure protruding from the rear surface of the front cover 152.

Such a guide structure of sound is only one example, and may be modified in various shapes, and the guide structure may be provided only at any one of the front cover 152 and the panel body 151.

Figure 6:
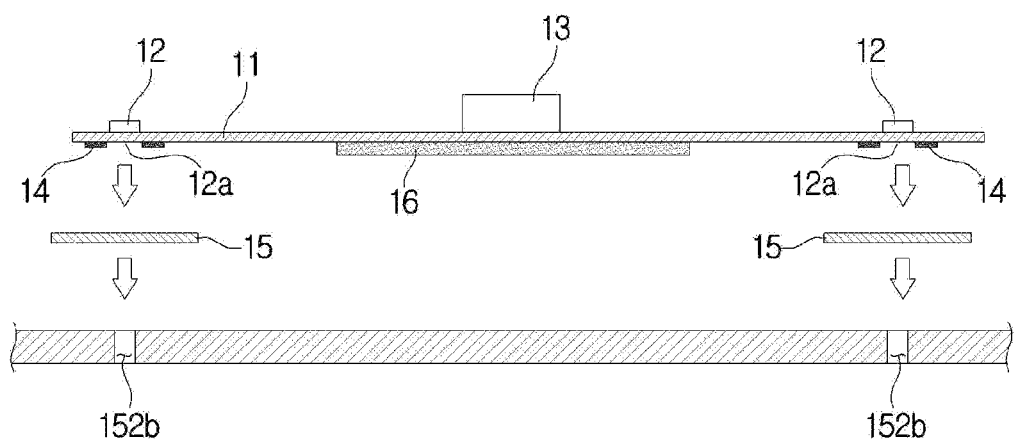
FIG. 6 is a view illustrating a state before a microphone unit is installed on a front cover of the washing machine.
Figure 7:
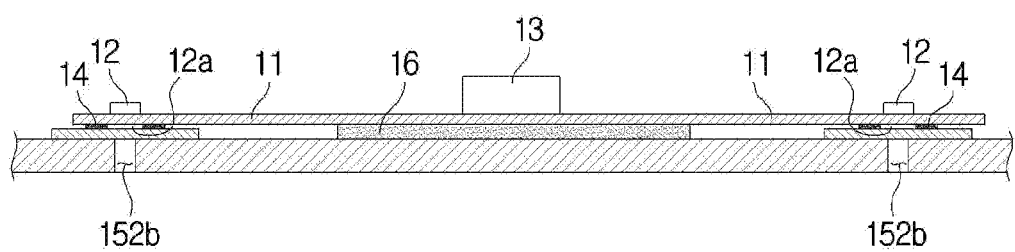
FIG. 7 is a view illustrating a state in which the microphone unit is installed on the front cover of the washing machine.

FIG. 6 is a view illustrating a state before a microphone unit is installed on a front cover of the washing machine, and FIG. 7 is a view illustrating a state in which the microphone unit is installed on the front cover of the washing machine.

According to an embodiment with reference to FIG. 6, a buffer member 14 may be disposed around the sensing portion 12*a* of the microphone chip 12. The buffer member 14 may be disposed between the sensing portion 12*a* and the rear surface of the front cover 152 in order to prevent vibration and noise caused by the operation of the washing machine 100 from being transmitted from the front cover 152 to the sensing portion 12*a* and may be made of a material having a foam form for absorbing vibration and noise.

The buffer member 14 may be formed in a ring shape to surround a periphery of the sensing portion 12*a*.

An adhesive may be applied to both surfaces of the buffer member 14 such that the buffer member 14 may be attached to the printed circuit board 11 and a waterproof sheet 15 which will be described later.

The waterproof sheet 15 may be disposed between the buffer member 14 and the rear surface of the front cover 152, and the adhesive may be applied to a front surface of the waterproof sheet 15.

The waterproof sheet 15 may block inflow of moisture from the outside to the microphone unit 10 and release moisture inside the front cover 152 to the outside and may be formed of a material that is advantageous for sound transmission.

A double-sided tape 16 may be disposed between the microphone unit 10 and the front cover 152 to fix the microphone unit 10.

Referring to FIG. 7, the waterproof sheet 15 may be attached around the microphone hole 152*b* at the rear surface of the front cover 152 by an adhesive pre-applied on the front surface thereof, and thus the inflow of moisture into the sensing portion 12*a* through the microphone hole 152*b* may be blocked.

A front surface of the buffer member 14 may be bonded to a rear surface of the waterproof sheet 15, and a rear surface of the buffer member 14 may be bonded to surround the sensing portion 12*a*.

Like the buffer member 14, the double-sided tape 16 may be formed of a material having a foam form to prevent the vibration and noise of the front cover 152 from being transmitted to the microphone unit 10 and fix the microphone unit 10 to the rear surface of the front cover 152.

Figure 9:
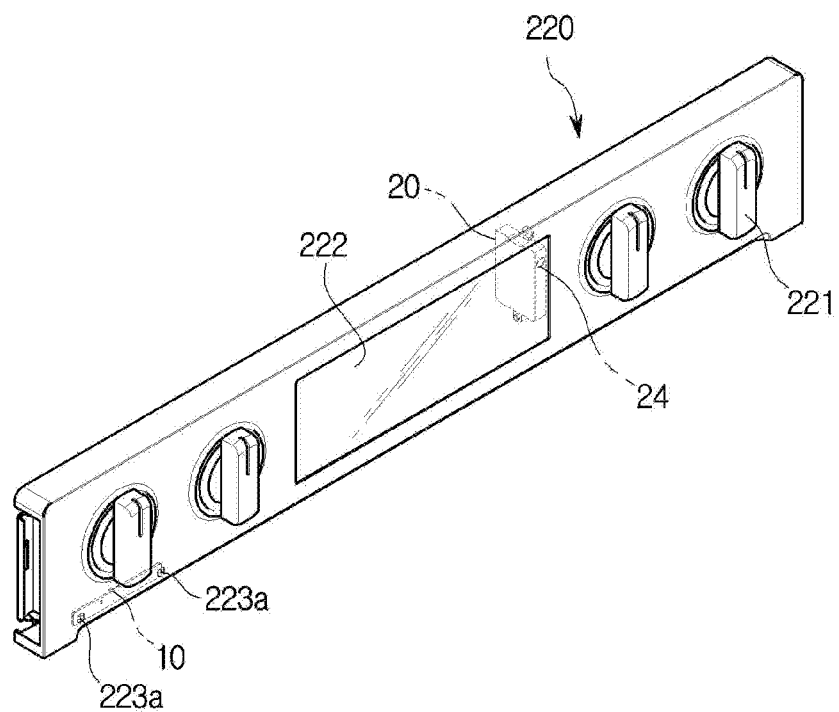
FIG. 9 is an enlarged view of a control panel in FIG. 8.
Figure 10:
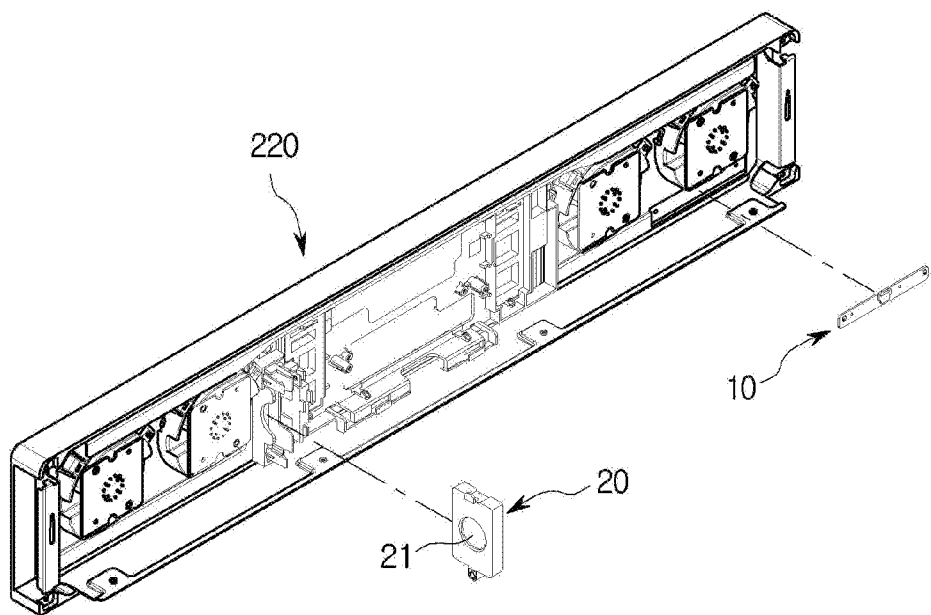
FIG. 10 is a view illustrating a state in which a microphone unit and a speaker unit are disassembled from a rear surface of the control panel.
Figure 11:
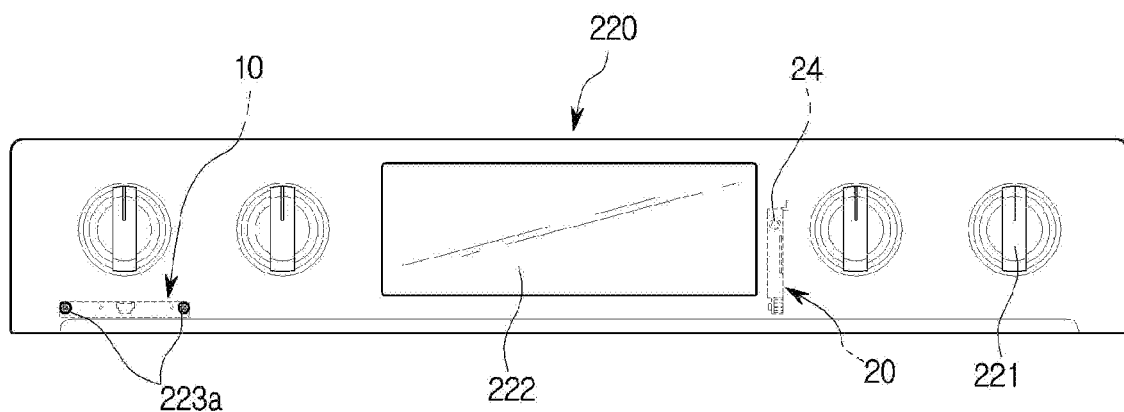
FIG. 11 is a view illustrating a state in which the microphone unit and the speaker unit are assembled.

FIG. 8 is a perspective view of an oven as a home appliance according to another embodiment of the disclosure. FIG. 9 is an enlarged view of a control panel in FIG. 8. FIG. 10 is a view illustrating a state in which a microphone unit and a speaker unit are disassembled from a rear surface of the control panel. FIG. 11 is a view illustrating a state in which the microphone unit and the speaker unit are assembled.

Referring to FIGS. 8 to 11, the oven 200, in one embodiment, an oven 200 may include a main body 201 forming an outer appearance and a door 210 disposed on a front surface of the main body 201 to open and close a cavity formed in the main body 201.

A control panel 220 provided with a manipulator 221 for operating a function of the oven 200 and a display 222 for indicating an operation state of the oven 200 may be disposed above the door 210.

A cooktop 230 may be provided on a top portion of the main body 210 to place and heat a container containing food. However, the oven 200 having the cooktop 230 is only an example according to an embodiment, and the cooktop 230 may not be provided.

The control panel 220 may be provided with the microphone unit 10 and the speaker unit 20 applied to the washing machine 100 described above.

The microphone unit 10 and the speaker unit 20 may have the same or similar structure as those installed in the washing machine 100. Functions of the microphone unit 10 and the speaker unit 20 may be the same as those applied to the washing machine 100 described above, and thus a detailed description thereof will be omitted.

When the microphone unit 10 and the speaker unit 20 are installed in the oven 200 according to an embodiment, because the internal space and configuration of the control panel 220 are different from those of the control panel 150 of the washing machine 100, the arrangement position and installation structure of the microphone units 10 and the speaker units 20 may be different from each other.

For example, the microphone unit 10 may be disposed to be biased to one side of the control panel 220 and may be disposed below the manipulator 221.

The speaker unit 20 may be spaced apart from the microphone unit 10 and disposed adjacent to one side of the display 222.

The structure in which the microphone unit 10 is installed in the control panel 220 may be the same as the installation structure of the microphone unit 10 in the washing machine 100 described above.

Accordingly, a microphone hole 223a may be provided on a front cover 223 of the control panel 220, and a front surface of the microphone unit 10 may be fixed to the rear surface of the control panel 220 such that the sensing portion 12a (FIG. 6) of the microphone unit 10 directs to the front of the oven 200.

In addition, the buffer member 14 (FIG. 6) may be similarly attached around the sensing portion 12a (FIG. 6), and in order to fix the microphone unit 10, the double-sided tape 16 (FIG. 6) may also be disposed between the rear surface of the control panel 220 and the front surface of the microphone unit 10.

However, in the case of the waterproof sheet 15 (FIG. 6), the waterproof sheet 15 (FIG. 6) may be omitted in that a large amount of moisture is less likely to flow into the control panel 220 in a process of using the oven 200.

When a space for arranging components inside the control panel 220 is small, the speaker unit 20 may be disposed such that the diaphragm 21 of the speaker unit 20 directs to a side surface of the oven 200 as shown in the drawing, and in this case, a fixing structure of the speaker unit 20 may be the same as the structure applied to the washing machine 100.

As the diaphragm 21 of the speaker unit 20 is disposed to direct to the side surface of the oven 200, a hole 24 communicating with the diaphragm 21 may be provided on one side surface of the speaker unit 20 such that sound output from the speaker unit 20 may direct to the front.

Figure 12:
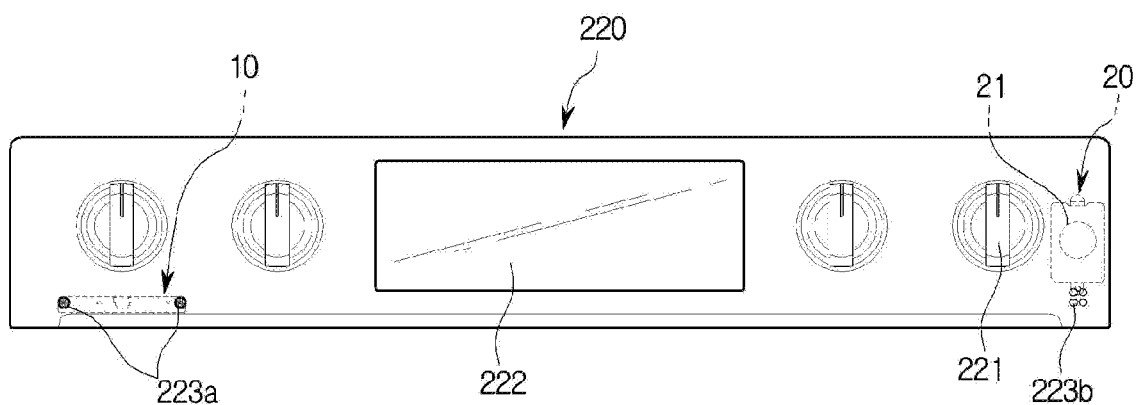
FIG. 12 is a view illustrating the arrangement of a speaker unit according to another embodiment.

FIG. 12 is a view illustrating the arrangement of a speaker unit according to another embodiment.

Referring to FIG. 12, the microphone unit 10 is disposed on one side of the control panel 220 as in the previous embodiment, but the speaker unit 20 may be disposed on the other side of the control panel 220.

According to an embodiment, the speaker unit 20 may be disposed to direct to the front of the diaphragm 21 the same as that applied to the washing machine 100. In addition, a speaker hole 223b may be provided on the control panel 220 below the speaker unit 20 to prevent the inflow of moisture.

Figure 14:
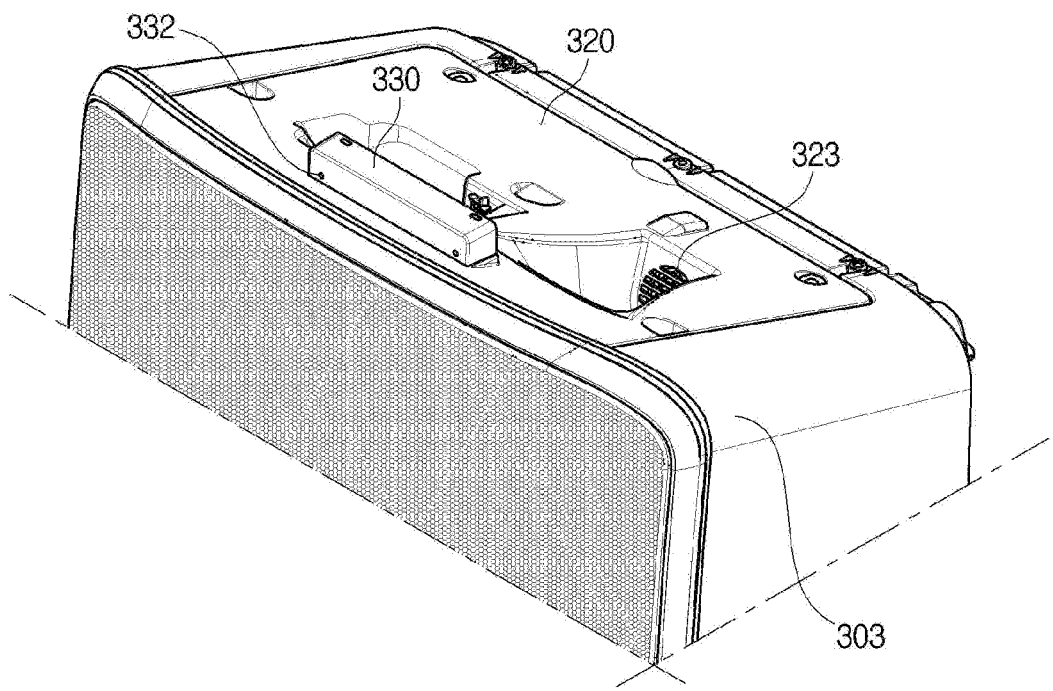
FIG. 14 is an enlarged view of an upper portion of the indoor unit in FIG. 13.
Figure 15:
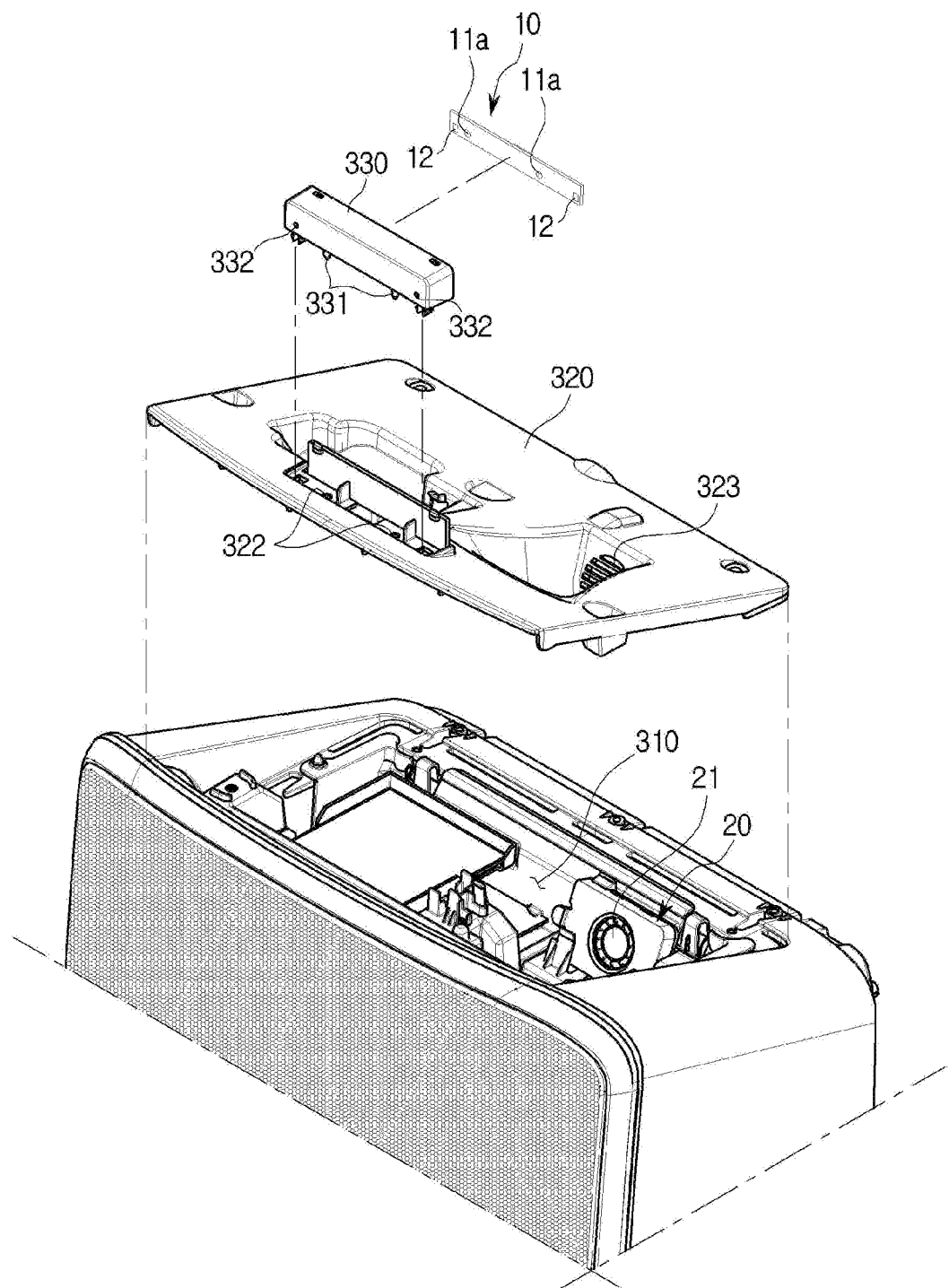
FIG. 15 is a view illustrating a state in which some components in FIG. 14 are disassembled.

FIG. 13 is a view illustrating an indoor unit of an air conditioner as a home appliance according to another embodiment of the disclosure, FIG. 14 is an enlarged view of an upper portion of the indoor unit in FIG. 13, and FIG. 15 is a view illustrating a state in which some components in FIG. 14 are disassembled.

Referring to FIGS. 13 to 15, an indoor unit 300 may include a main body 301 forming an outer appearance, and a plurality of discharge ports 302 for blowing air may be provided on a front surface of the main body 301.

An electrical equipment compartment 310 may be provided at an upper portion of the main body 301 such that various electric and electronic elements for performing functions of the air conditioner may be installed.

The electrical equipment compartment 310 may be provided to be partitioned from a flow path inside the indoor unit 300 so as not to be affected by airflow inside the indoor unit 300.

A substrate 311 for controlling and the speaker unit 20 for outputting sound may be disposed in the electrical equipment compartment 310. An opened upper portion of the electrical equipment compartment 310 may be opened and closed by an electrical equipment compartment cover 320.

The speaker unit 20 may be disposed at one side of the electrical equipment compartment 310, and a speaker hole 323 for outputting sound may be provided on the electrical equipment compartment cover 320.

The microphone unit 10 for speech recognition may be disposed in the front of the electrical equipment compartment 310 to be spaced apart from the speaker unit 20 and may be disposed on the center of the upper end portion of the indoor unit 300 as a whole.

The microphone unit 10 may be installed in the indoor unit 100 as a box-shaped case 330 is coupled to an upper surface 303 of the indoor unit 300 in a state where the microphone unit 10 is installed to and received in the case 330.

A coupling hook 331 for coupling with the upper surface 303 of the indoor unit 300 may be provided at a lower portion of the case 330, and a hooking portion 322 into which the coupling hook 331 is detachably inserted may be provided on the electrical equipment compartment cover 320 forming the upper surface 303 of the indoor unit 300.

Accordingly, the microphone unit 10 may be detachably coupled to the main body 301 to facilitate repair or replacement.

The structure in which the microphone unit 10 is installed in the case 330 may be the same as the installation structure of the microphone unit 10 in the washing machine 100 described above.

Therefore, the microphone hole 332 may be provided in a front surface of the case 330, and the front surface of the microphone unit 10 may be fixed to a rear surface of the case 330 such that the sensing portion 12*a* (FIG. 6) of the microphone unit 10 directs to the front of the indoor unit 300.

In addition, the buffer member 14 (FIG. 6) may be similarly attached around the sensing portion 12*a* (FIG. 6), and in order to fix the microphone unit 10, the double-sided tape 16 (FIG. 6) may also be disposed between the rear surface of the case 330 and the front surface of the microphone unit 10.

However, in the case of the waterproof sheet 15 (FIG. 6), the waterproof sheet 15 (FIG. 6) may be omitted in that a large amount of moisture is less likely to flow into the upper surface 303 in a process of using the indoor unit 300.

Functions of the microphone unit 10 and the speaker unit 20 may be the same as those applied to the microphone unit 10 and the speaker unit 20 of the washing machine 100 described above, and thus a detailed description thereof will be omitted.

While the disclosure has been described with reference to example embodiments, it should be understood by those of skilled in the art that various changes in form and details may be made without departing from the spirit and scope of the disclosure.

What is claimed is:

1. A home appliance, comprising:
an electrical equipment compartment disposed in an upper portion of the home appliance, and including an upper side that is open;
an electrical equipment compartment cover covering the open upper side of the electrical equipment compartment, forming at least a portion of an upper surface of the home appliance, and including a speaker hole;
a microphone accommodating portion protruding upward from the electrical equipment compartment cover and including a front portion that includes microphone holes laterally spaced apart from each other and that faces toward a front of the home appliance;
a microphone unit including a printed circuit board (PCB) disposed behind the microphone holes in the microphone accommodating portion, and microphone chips mounted on the PCB and corresponding respectively to the microphone holes so that a sensing portion of each microphone chip of the microphone chips is aligned with the corresponding microphone hole of the microphone holes; and
a speaker unit disposed in the electrical equipment compartment and positioned to emit sound through the speaker hole.

2. The home appliance of claim 1, wherein the electrical equipment compartment cover is detachably coupled to the upper side of the electrical equipment compartment so as to be removable, by being detached from the upper side of the electrical equipment compartment, to access the electrical equipment compartment.

3. The home appliance of claim 2, wherein the front portion includes an inner surface which faces toward a rear of the home appliance, and the PCB is fixed to the inner surface of the front portion.

4. The home appliance of claim 1, wherein
the microphone holes include a first microphone hole and a second microphone hole,
the microphone chips include a first microphone chip corresponding to the first microphone hole so that a sensing portion of first microphone chip is aligned with the first microphone hole, and a second microphone chip corresponding to the second microphone hole so that a sensing portion of the second microphone chip is aligned with the second microphone hole,
the PCB further includes a connector disposed between the first microphone chip and the second microphone chip, and
a terminal is connected to the connector for speech signals received via the first microphone chip and the second microphone chip to be transmitted from the PCB.

5. The home appliance of claim 1, wherein
the microphone holes include a first microphone hole disposed on a left side of the front portion and a second microphone hole disposed on a right side of the front portion, and
the microphone chips include a first microphone chip corresponding to the first microphone hole so that a sensing portion of first microphone chip is aligned with the first microphone hole, and a second microphone chip corresponding to the second microphone hole so that a sensing portion of the second microphone chip is aligned with the second microphone hole.

6. The home appliance of claim 5, wherein the front portion includes an inner surface which faces toward a rear of the home appliance, and the PCB is attached to the inner surface of the front portion via a double-sided tape.

7. The home appliance of claim 1, wherein
the microphone holes include a first microphone hole and a second microphone hole,
the microphone chips include a first microphone chip and a second microphone chip spaced apart from each other by a distance greater than or equal to 30 mm and less than or equal to 100 mm, and
the first microphone chip corresponds to the first microphone hole so that a sensing portion of first microphone chip is aligned with the first microphone hole, and the second microphone chip corresponds to the second microphone hole so that a sensing portion of the second microphone chip is aligned with the second microphone hole.

* * * * *